US011626838B2

(12) United States Patent
Abe

(10) Patent No.: US 11,626,838 B2
(45) Date of Patent: Apr. 11, 2023

(54) QUARTZ CRYSTAL DEVICE, CRYSTAL UNIT, AND CRYSTAL CONTROLLED OSCILLATOR

(71) Applicant: NIHON DEMPA KOGYO CO., LTD., Tokyo (JP)

(72) Inventor: Tomonori Abe, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

(21) Appl. No.: 17/841,674

(22) Filed: Jun. 16, 2022

(65) Prior Publication Data
US 2022/0416721 A1    Dec. 29, 2022

(30) Foreign Application Priority Data
Jun. 29, 2021 (JP) .............................. JP2021-107316

(51) Int. Cl.
*H03B 5/32* (2006.01)
*H03B 5/00* (2006.01)

(52) U.S. Cl.
CPC ................. *H03B 5/32* (2013.01); *H03B 5/00* (2013.01)

(58) Field of Classification Search
CPC .................................... H03B 5/00; H03B 5/32
USPC ............................................. 331/116 R, 158
See application file for complete search history.

(56) References Cited

U.S. PATENT DOCUMENTS

2020/0195224 A1*  6/2020  Matsuo ................... H03H 9/19

FOREIGN PATENT DOCUMENTS

JP         2019057871         4/2019

* cited by examiner

*Primary Examiner* — Arnold M Kinkead
(74) *Attorney, Agent, or Firm* — JCIPRNET

(57) ABSTRACT

A quartz crystal device includes a package, a pedestal, and a crystal element. The pedestal is disposed in the package. The crystal element is bonded to the pedestal at four points. An angle formed by a center line connecting midpoints of both short sides of the crystal element and a straight line connecting a center point of the center line and each of bonding points is 22° or more and 30° or less.

4 Claims, 10 Drawing Sheets

RELATED ART

QUARTZ CRYSTAL DEVICE, CRYSTAL UNIT, AND CRYSTAL CONTROLLED OSCILLATOR

CROSS-REFERENCE TO RELATED APPLICATIONS

This application is based on and claims priority under 35 U.S.C. § 119 to Japanese Patent Application No. 2021-107316, filed on Jun. 29, 2021, the entire content of which is incorporated herein by reference.

TECHNICAL FIELD

This disclosure relates to a quartz crystal device, a crystal unit, and a crystal controlled oscillator, and especially relates to a quartz crystal device having satisfactory acceleration sensitivity characteristics small in variation, and a crystal unit and a crystal controlled oscillator including the quartz crystal device.

DESCRIPTION OF THE RELATED ART

Description of the Related Art

As a quartz crystal device that includes a crystal element in a ceramic package, there is a quartz crystal device with pedestal in which a crystal element is mounted on a pedestal fixed to a package.

There has been a quartz crystal device with pedestal in which a crystal element and a pedestal are bonded together to be fixed at four points using adhesives.

Since the number of bonding points is many in the quartz crystal device, a variation is likely to occur in a manufacturing process, and bonding positions and bonding dimensions are important factors to determine the characteristics.

Specifically, a variation in angle of the bonding points viewed from the center of the crystal element largely affects acceleration sensitivity.

Influence due to Stress on Outline of Crystal Unit: FIG. 10

FIG. 10 is an explanatory drawing illustrating the influence of the stress on the outline of the crystal unit.

As illustrated in FIG. 10, in theory, it has been known that, seeing the influence of stress according to a rotation angle from an X-axis, points where stress sensitivity becomes zero are present at positions of about 30° from a Z'-axis direction (positions of the rotation angles 60° and 120° from the X-axis).

Here, an X'-axis is at a position where a Z-axis is rotated by 35° 15' with an X-axis of a quartz crystal as a rotation axis, and is equivalent to a short side direction of an AT-cut crystal element.

Related Art

Note that as the related art regarding a quartz crystal device with pedestal, there is Japanese Unexamined Patent Application Publication No. 2019-057871 "QUARTZ CRYSTAL DEVICE" (Patent Literature 1).

Patent Literature 1 discloses the quartz crystal device having a structure facilitating improvement in characteristics and cost reduction by the use of a pedestal.

As described above, since the bonding points between the pedestal and the crystal element are many, the four points, in the conventional quartz crystal device with pedestal, the angles of the bonding points viewed from the center of the crystal element are likely to vary. This has caused problems of deterioration of the acceleration sensitivity characteristics and an increase in variation in characteristics.

Note that Patent Literature 1 does not disclose a quartz crystal device in which a crystal element is bonded to a pedestal at four points and a center line passing through midpoints of both short sides of the crystal element meets a straight line connecting a midpoint of the center line and each of the bonding points at an angle of 22° or more and 30° or less.

A need thus exists for a quartz crystal device which is not susceptible to the drawbacks mentioned above.

SUMMARY

An embodiment of this disclosure provides a quartz crystal device that includes a package, a pedestal, and a crystal element. The pedestal is disposed in the package. The crystal element is bonded to the pedestal at four points. An angle formed by a center line connecting midpoints of both short sides of the crystal element and a straight line connecting a center point of the center line and each of bonding points is 22° or more and 30° or less.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

The following describes embodiments of this disclosure with reference to the drawings.

Outline of the Embodiments

Figure 1:
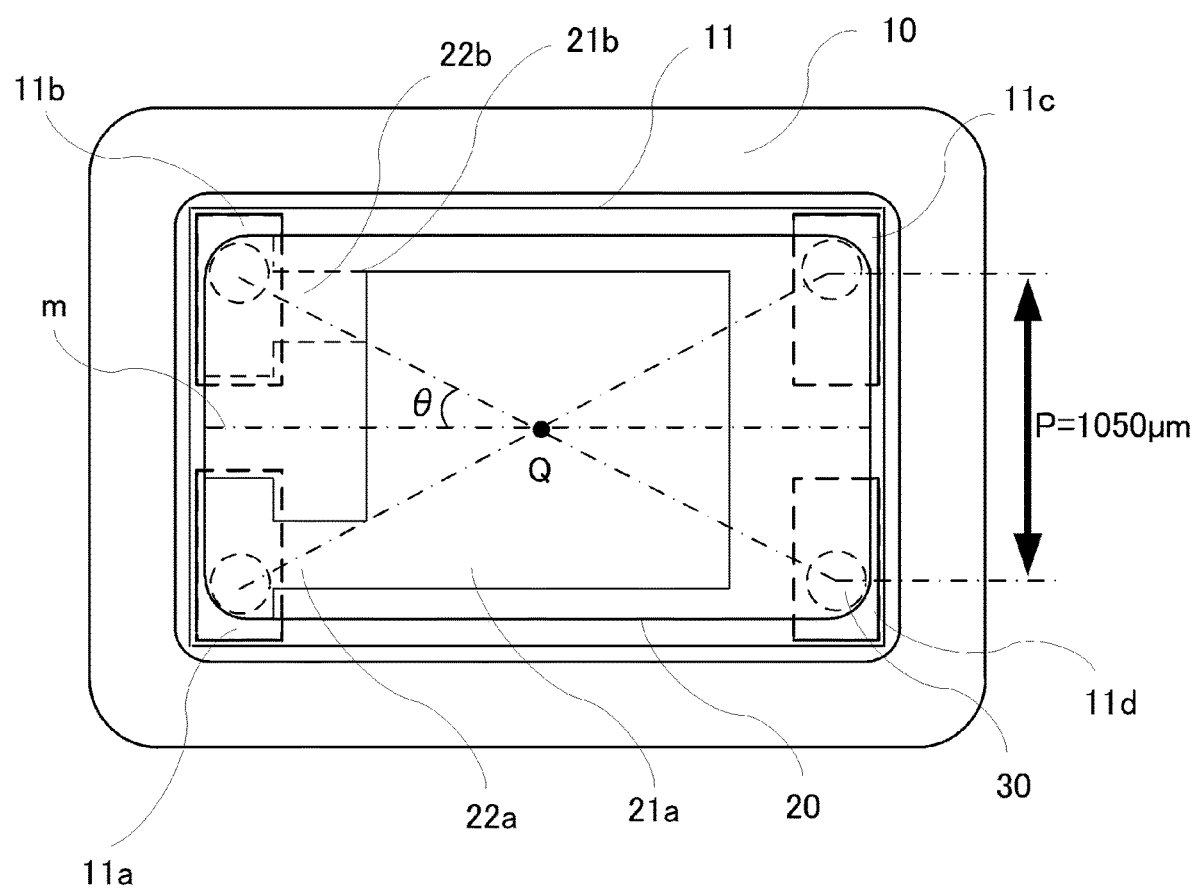
FIG. 1 is a plan view illustrating a configuration of a quartz crystal device (1)
Figure 2:
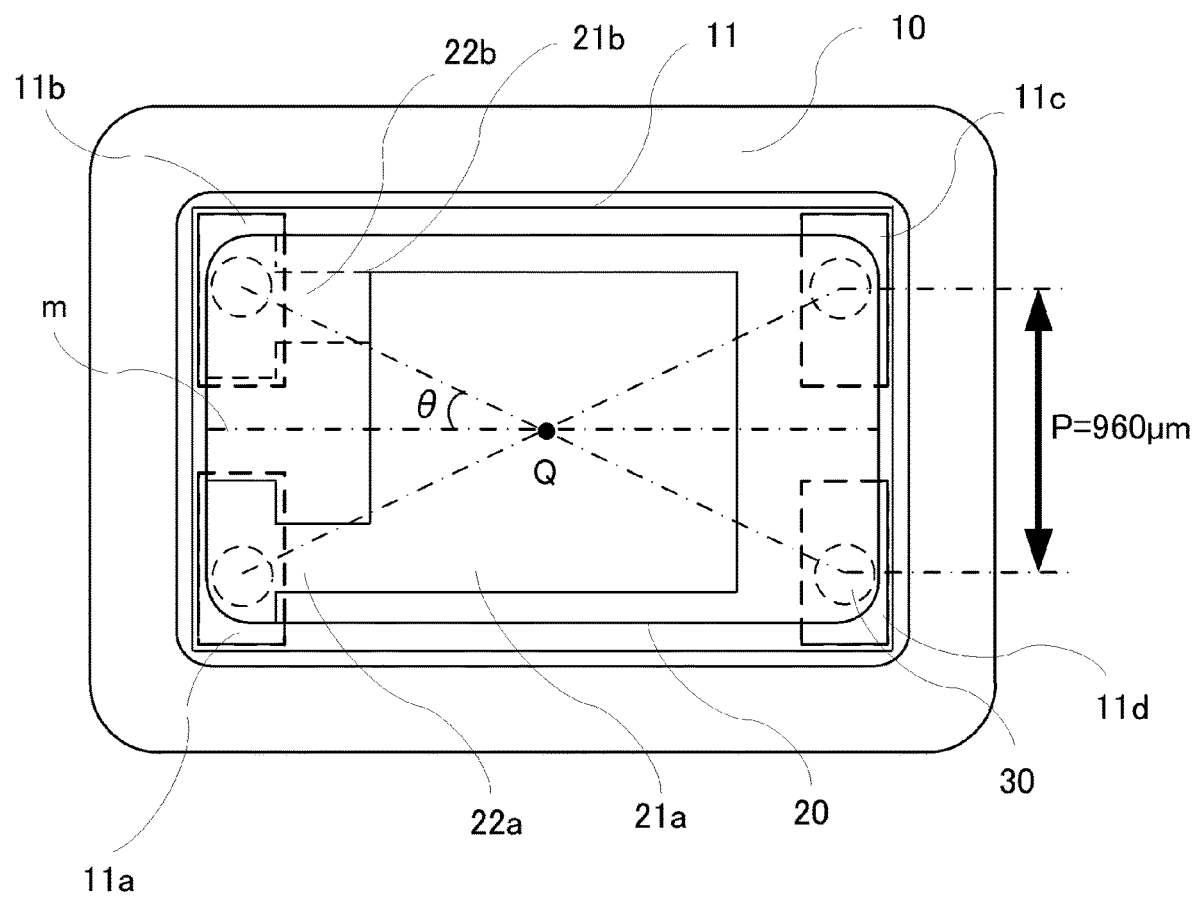
FIG. 2 is a plan view illustrating a configuration of a quartz crystal device (2)
Figure 3:
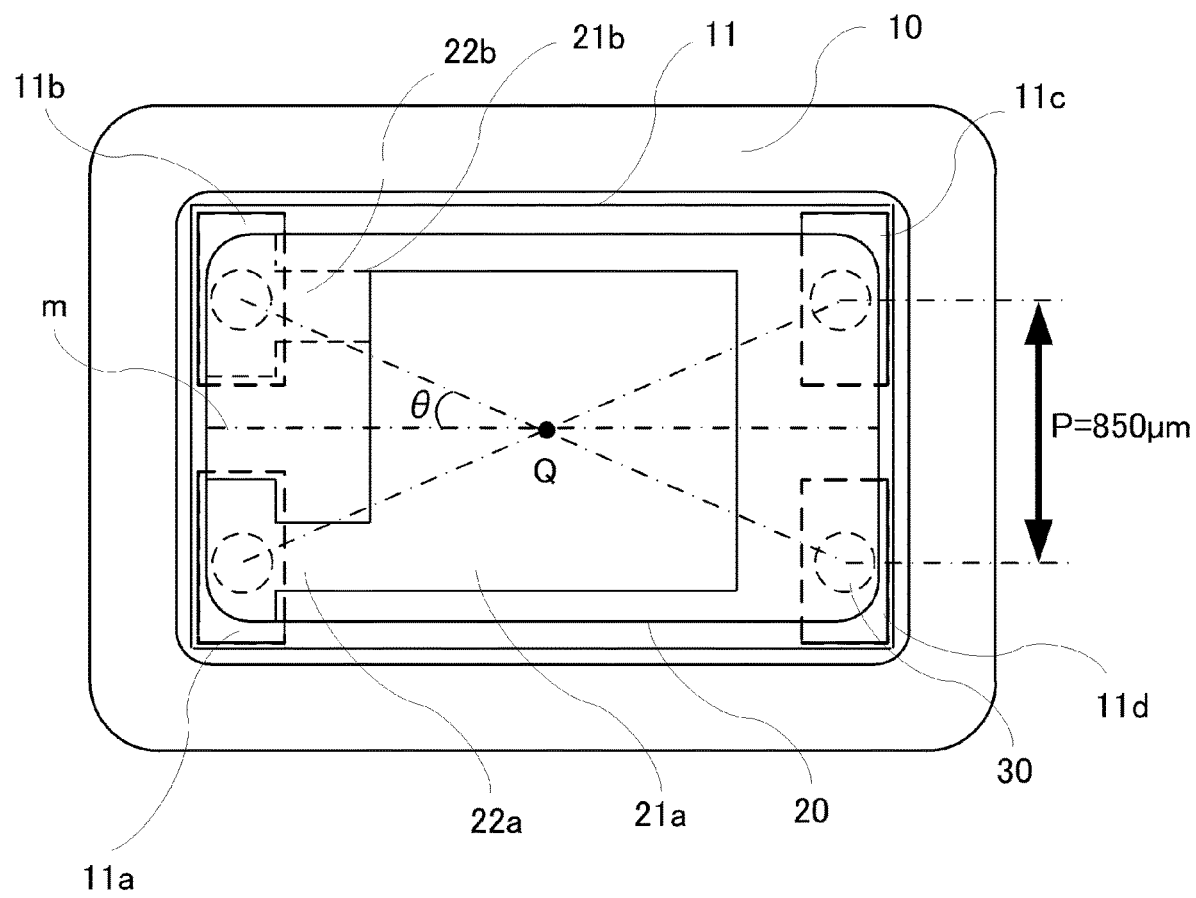
FIG. 3 is a plan view illustrating a configuration of a quartz crystal device (3)

A quartz crystal device (this quartz crystal device) according to embodiments of this disclosure includes a pedestal on which a crystal element is mounted inside a package. The crystal element is bonded to the pedestal at four points. A center line passing through midpoints of both short sides of the crystal element meets a straight line connecting a center and each of bonding points at an angle of 22° or more and 30° or less. The quartz crystal device having satisfactory acceleration sensitivity characteristics small in variation can be achieved.
Configurations of these Quartz Crystal Devices: FIG. 1 to FIG. 3

In this quartz crystal device, the bonding position of the crystal element and the pedestal, especially the angle of the bonding point to the center line viewed from the center of the crystal element is set to be in a range of 22° to 30° to provide the satisfactory acceleration sensitivity characteristics and reduce the variation.

FIG. 1 is a plan view illustrating a configuration of a quartz crystal device (1), FIG. 2 is a plan view illustrating a configuration of a quartz crystal device (2), and FIG. 3 is a plan view illustrating a configuration of a quartz crystal device (3).

In these quartz crystal devices (1) to (3), bonding positions are changed in quartz crystal devices using the same type of product. Specifically, an angle (a bonding angle θ) where a line connecting a center Q of a crystal element and a bonding point meets a center line m as a line segment that divides a short side of the crystal element into two is changed into three types to configure these quartz crystal devices (1) to (3).

Since the basic configurations of these quartz crystal devices (1) to (3) are the same, the configuration of this quartz crystal device will be described with reference to FIG. 1 with this quartz crystal device (1) as an example.

As illustrated in FIG. 1, this quartz crystal device has a depressed portion and includes a package 10 and a crystal element 20. A pedestal 11 is formed in the depressed portion in the package 10, and the crystal element 20 is mounted on the pedestal 11. The crystal element 20 is fixed to the pedestal 11 with adhesives 30.

That is, the crystal element 20 is bonded to the pedestal 11 at four points.

The package 10 has a configuration in which insulating materials, such as ceramic, are stacked, and includes the depressed portion housing the crystal element 20.

Here, this quartz crystal device has a package size of 3.2 mm×2.5 mm, and the crystal element 20 has a size of 1.4 mm in short side and 2.1 mm in long side.

The pedestal 11 has a shape of partially forming a depressed portion by cutting out a rectangular crystal plate or a flat plate shape not having the depressed portion. The crystal element 20 is mounted on the pedestal 11. Electrode patterns 11a to 11d made of gold are formed on four corners of the pedestal 11.

The adhesives 30 are conductive adhesives or non-conductive adhesives that fix the crystal element 20 to the electrode patterns 11a to 11d on the pedestal 11.

The crystal element 20 has an approximately rectangular shape, an excitation electrode 21a is formed on a front surface, and an excitation electrode 21b is formed on a back surface.

A pull-out portion 22a of the excitation electrode 21a on the front surface is pulled out in the short side direction on the left side of FIG. 1.

Although the excitation electrode 21b on the back surface is not seen in FIG. 1, a pull-out portion 22b is pulled out in the short side direction on the left side.

The crystal element 20 is fixed to the pedestal 11 with the adhesives 30 at two parts close to the short side on the left side and two parts close to the short side on the right side.

Specifically, the short side on the left side of the crystal element 20 is fixed to the electrode patterns 11a and 11b on the pedestal 11, and the short side on the right side is fixed to the electrode patterns 11c and 11d.

Note that the electrode patterns 11a and 11b are connected to the pull-out portions 22a and 22b of the excitation electrodes 21a and 21b formed on the crystal element 20 with conductive adhesives, and are further connected to an IC for oscillation via a wiring pattern formed on the package 10.

The crystal element 20 may be connected to the electrode patterns 11c and 11d with conductive adhesives or non-conductive adhesives.

In manufacturing these quartz crystal devices (1) to (3), to adjust the bonding angle θ between the pedestal 11 and the crystal element 20, a value of a distance between bonding points P where measurement was easy was changed.

As illustrated in FIG. 1, the distance between bonding points P of this quartz crystal device (1) was 1050 μm. In the products used for these quartz crystal devices (1) to (3), when the distance between bonding points P of the quartz crystal device (1) was 1050 μm, the average of the bonding angles θ where the line connecting the center Q of the crystal element 20 and each of the bonding points met the center line m (the line segment passing through the midpoints on both short sides of the crystal element 20) was 28.1°.

Note that the center Q is the midpoint of the center line.

In this quartz crystal device (2), using the product of the same type as this quartz crystal device (1) illustrated in FIG. 1, the bonding position when bonding the crystal element 20 and the pedestal 11 together is changed.

Specifically, in this quartz crystal device (2), the distance between bonding points P was 960 μm, and the average of the four bonding angles θ was 26.9°.

Similarly, in this quartz crystal device (3), as illustrated in FIG. 3, the distance between bonding points P was 850 μm, and the average of the bonding angles θ was 24.6°.

That is, the length of the distance between bonding points P is this quartz crystal device (1)>this quartz crystal device (2)>this quartz crystal device (3), and the magnitudes of the bonding angles θ are in the same order.

Figure 4:
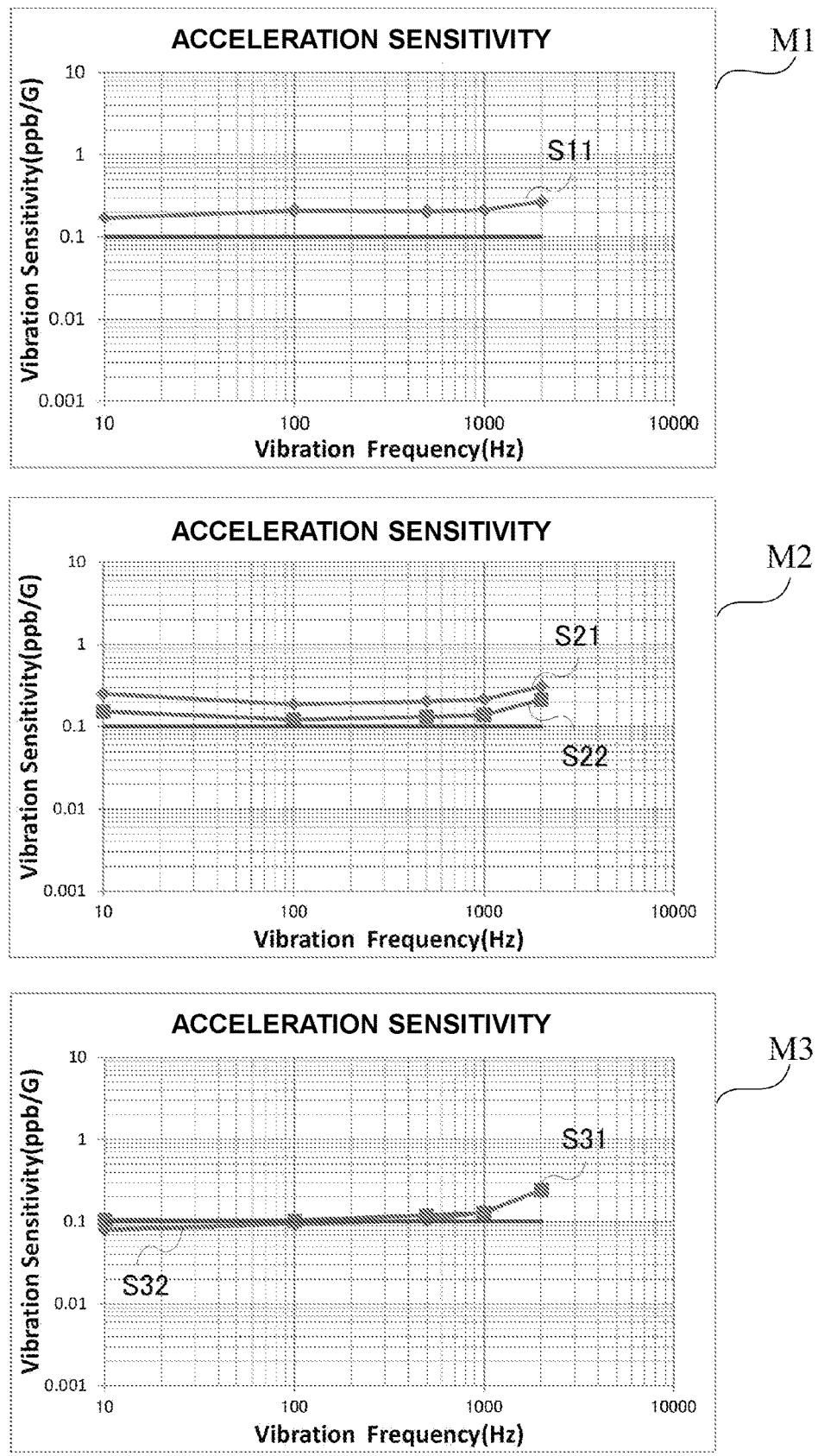
FIG. 4 includes explanatory drawings illustrating measurement results of acceleration sensitivity of these quartz crystal devices (1) to (3)

Acceleration Sensitivity Measurement Results: FIG. 4

FIG. 4 illustrates the results of measuring the acceleration sensitivity of these three quartz crystal devices. FIG. 4 includes explanatory drawings illustrating the measurement results of the acceleration sensitivity of these quartz crystal devices (1) to (3). M1 in FIG. 4 illustrates the measurement result of this quartz crystal device (1), M2 in FIG. 4 illustrates the measurement result of this quartz crystal device (2), and M3 in FIG. 4 illustrates the measurement result of this quartz crystal device (3).

In FIG. 4, the line of 0.1 (ppb/G) is a reference line indicative of the acceleration sensitivity as a reference.

Additionally, M1 in FIG. 4 illustrates the result of measuring one sample of this quartz crystal device (1) (S11), and M2 in FIGS. 4 and M3 in FIG. 4 illustrate the results of measuring two samples of this quartz crystal device (2) and this quartz crystal device (3), respectively (S21, S22, S31, and S32).

As illustrated in FIG. 4, all of these quartz crystal devices (1), (2), and (3) show the satisfactory acceleration sensitivity.

In comparison between M1, M2, and M3 in FIG. 4, the smaller the bonding angle θ is, the smaller the acceleration sensitivity is, which is satisfactory. This quartz crystal device (3) having the smallest bonding angle θ especially obtains the satisfactory characteristics.

Figure 5:
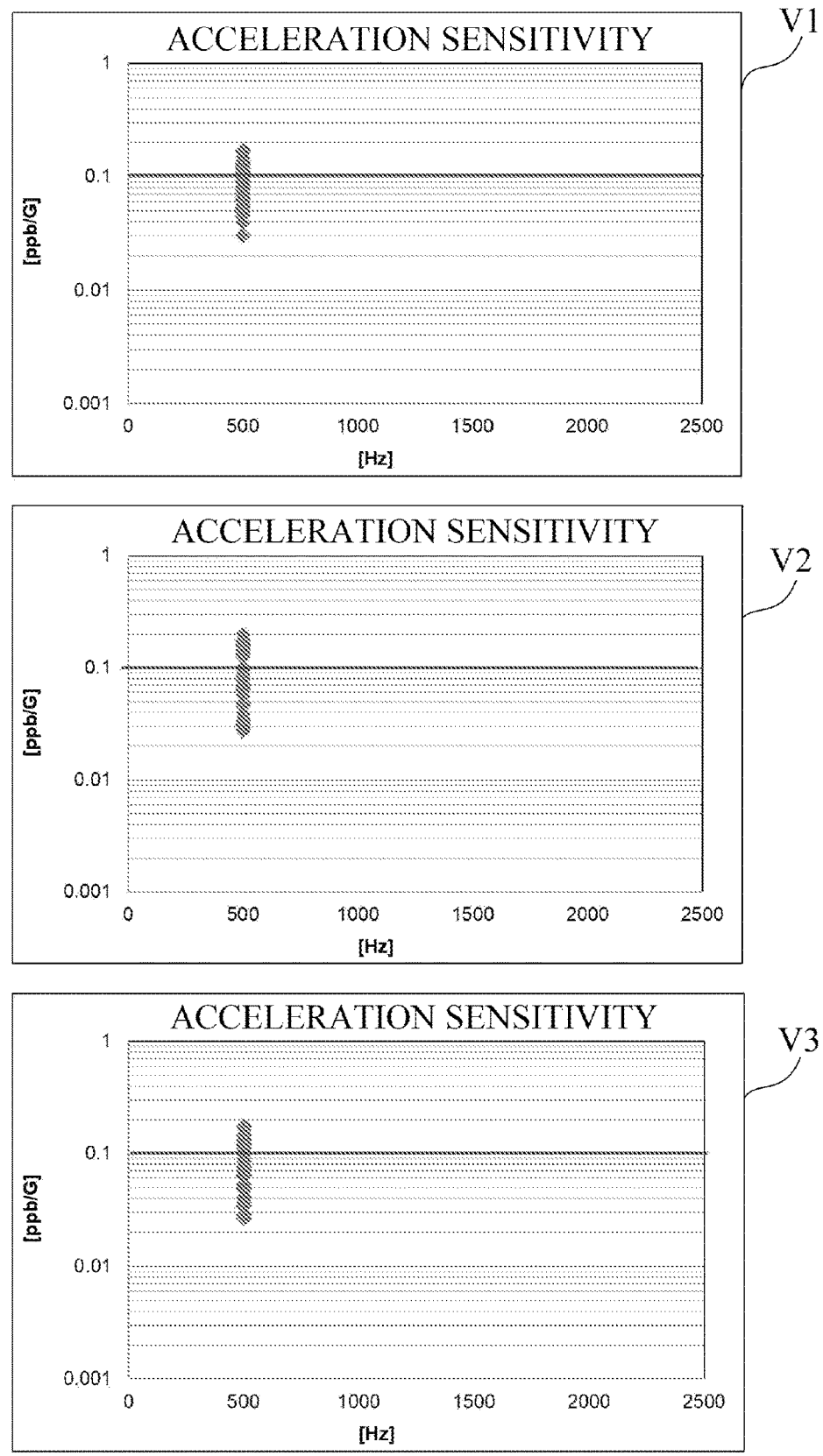
FIG. 5 includes explanatory drawings illustrating variations in acceleration sensitivity.

Variations in Acceleration Sensitivity: FIG. 5

Next, the variations in acceleration sensitivity of these quartz crystal devices (1) to (3) will be described with reference to FIG. 5. FIG. 5 includes explanatory drawings illustrating the variations in the acceleration sensitivity.

The numbers of samples were increased in these quartz crystal devices (1) to (3), and the acceleration sensitivity at an oscillation frequency of 500 Hz was measured to verify the variations.

As illustrated in V1 to V3 of FIG. 5, all of the variations in acceleration sensitivity of these quartz crystal devices (1) to (3) were satisfactory, and the degrees of the variations were similar.

It has been apparent from FIG. 4 and FIG. 5 that setting the average bonding angle θ at the bonding points between the crystal element 20 and the pedestal 11 in a range of 24.6° to 28.1° allows reducing the influence of stress applied to the crystal element 20 and providing the satisfactory acceleration sensitivity characteristics that are small in variation.

Figure 6:
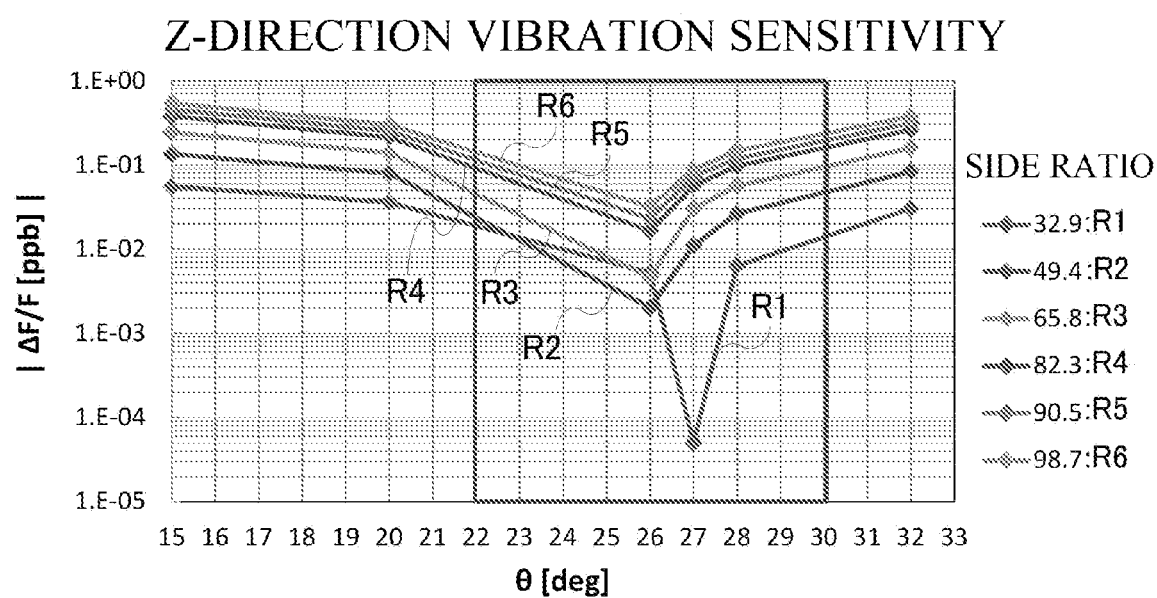
FIG. 6 is an explanatory drawing illustrating an influence on the acceleration sensitivity by a side ratio of a crystal element.

Influence by Side Ratio: FIG. 6

Next, the influence that the side ratio (the length (w) in a Z'-direction/thickness (t)) of the crystal element 20 gives the acceleration sensitivity in the Z'-direction will be described with reference to FIG. 6. FIG. 6 is an explanatory drawing illustrating the influence on the acceleration sensitivity by the side ratio of the crystal element.

Here, the acceleration sensitivity with respect to the bonding angles θ of six types of the crystal elements 20 having side ratios of 32.9 to 98.7 was calculated by simulation. FIG. 6 illustrates the calculation results of the corresponding acceleration sensitivity as R1 to R6.

As illustrated in R1 in FIG. 6, the crystal element 20 having a small side ratio has a large difference in acceleration sensitivity depending on the bonding angle θ, and the larger the side ratio is, the smaller the difference depending on the bonding angle θ is.

Additionally, it is seen that depending on the side ratio of the crystal element 20, the bonding angle θ at which the acceleration sensitivity characteristics become the smallest differs.

For example, with the side ratio of 32.9 (R1), the bonding angle θ at which the acceleration sensitivity characteristics become the best is 27°, but when the side ratio is 49.4 or more (R2 to R6), the characteristics are the best at 26°.

From the measurements and the simulation results using the samples, as in this quartz crystal device, the bonding angle θ where the line connecting the bonding point of bonding the crystal element 20 and the pedestal 11 together and the center meets the center line of the crystal element is set in the range of 22° to 30°. Thus, even using the crystal elements having various side ratios depending on the products, the satisfactory acceleration sensitivity characteristics small in variation can be obtained.

Especially, the bonding angle θ may be from 25° to 28° at which an effect of the best characteristics is provided.

Figure 7:
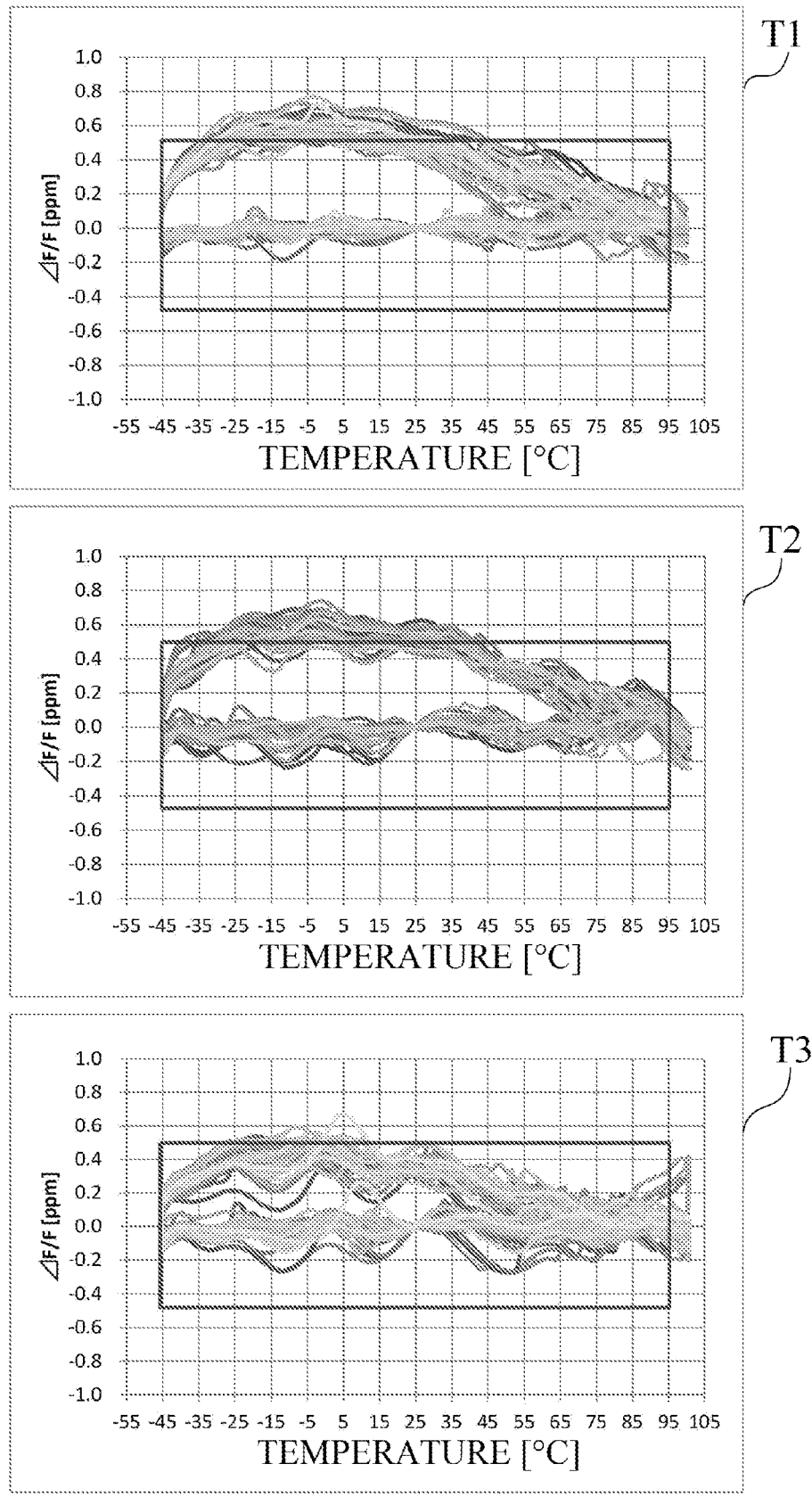
FIG. 7 includes explanatory drawings illustrating measurement results of frequency/temperature characteristics of these quartz crystal devices.

Frequency/Temperature Characteristics Measurement Results: FIG. 7

Next, the measurement results of the frequency/temperature characteristics of these quartz crystal devices will be described with reference to FIG. 7. FIG. 7 includes explanatory drawings illustrating the measurement results of frequency/temperature characteristics of these quartz crystal devices. T1 in FIG. 7 illustrates the measurement result of this quartz crystal device (1), T2 in FIG. 7 illustrates the measurement result of this quartz crystal device (2), and T3 in FIG. 7 illustrates the measurement result of this quartz crystal device (3).

Note that FIG. 7 illustrates deviations of frequencies (ΔF/F[ppm]) at each temperature when the temperature is increased from −45° C. up to 100° C. and when the temperature is decreased from 100° C. down to −45° C. of about 50 samples of each of these quartz crystal devices (1) to (3) in one graph.

Each drawing illustrates the temperature characteristics when the temperature is increased in the lower group among the two upper and lower groups and the temperature characteristics when the temperature is decreased in the upper group.

The frame indicated by the solid line in FIG. 7 is the reference range of the temperature characteristics. The smaller the distance between the upper curved line and the lower curved line is, the smaller the hysteresis is.

Comparisons of T1 to T3 in FIG. 7 find that, in this quartz crystal device (3) having a small bonding angle θ, the temperature characteristics are satisfactory and the hysteresis is small.

In all of T1 to T3 in FIG. 7, the upper graph approaches the lower graph at the high temperature side, and especially the upper graph intersects with the lower graph in T3 in FIG. 7.

Figure 8:
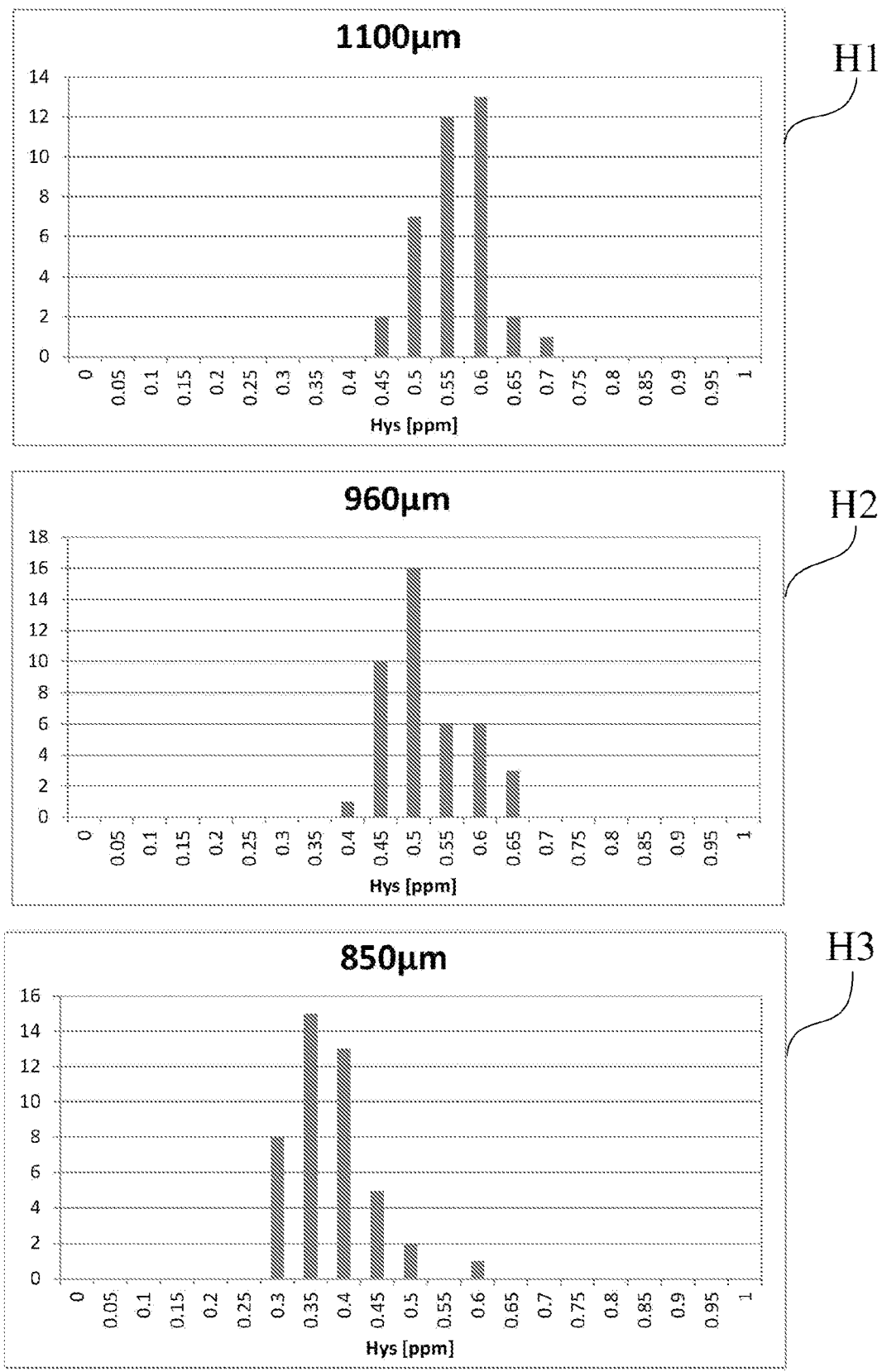
FIG. 8 includes explanatory drawings illustrating hysteresis distributions at 25° C.

Hysteresis Distributions at 25° C.: FIG. 8

Next, based on the temperature characteristics measurement results in FIG. 7, a hysteresis distribution at ordinary temperature (25° C.) was calculated. FIG. 8 includes explanatory drawings illustrating the hysteresis distributions (the number of samples) at 25° C. H1 in FIG. 8 illustrates the hysteresis distribution of this quartz crystal device (1), H2 in FIG. 8 illustrates the hysteresis distribution of this quartz crystal device (2), and H3 in FIG. 8 illustrates the hysteresis distribution of this quartz crystal device (3).

As illustrated in FIG. 8, the hysteresis distribution at 25° C. shifts to be smaller in the order of this quartz crystal device (1)>this quartz crystal device (2)>this quartz crystal device (3), and the hysteresis of this quartz crystal device (3) having the smallest bonding angle θ is the minimum.

Figure 9:
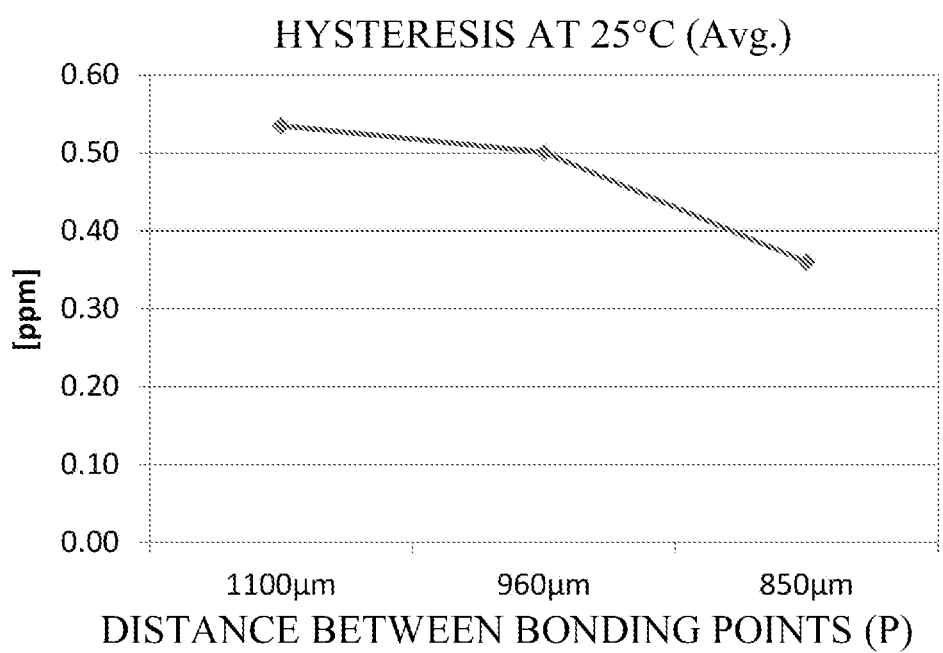
FIG. 9 is an explanatory drawing illustrating average values of hysteresis of temperature characteristics at 25° C.
Figure 10:
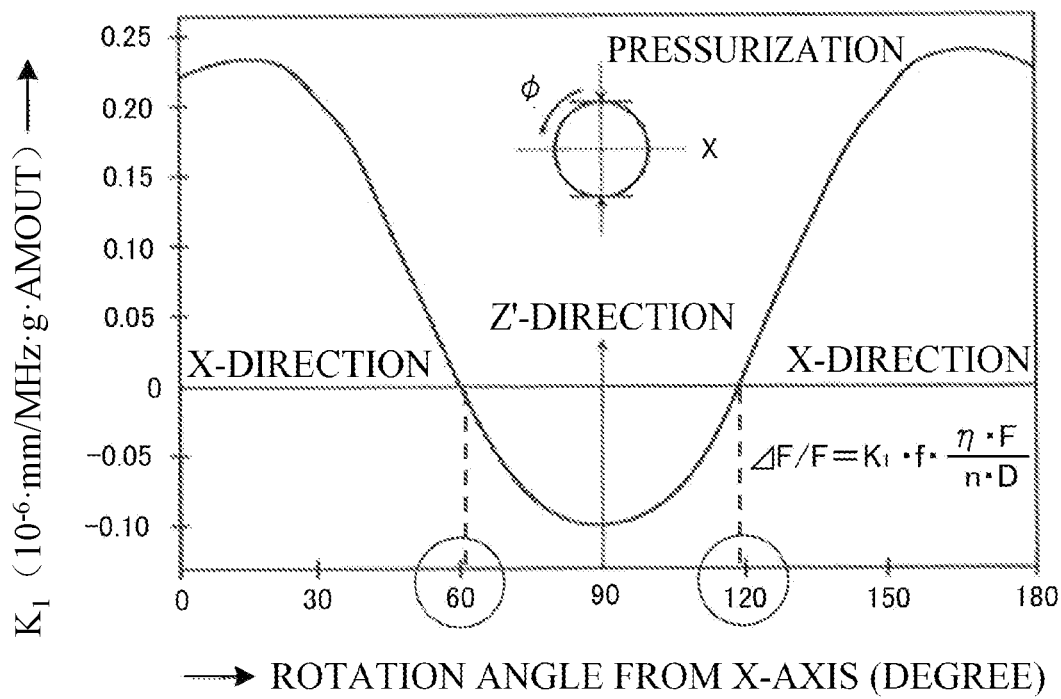
FIG. 10 is an explanatory drawing illustrating an influence by stress on an outline of a crystal unit.

Hysteresis at 25° C. (Average Value): FIG. 9

Based on the hysteresis distributions in FIG. 8, the average values of the hysteresis of the temperature characteristics at 25° C. in the three types of these quartz crystal devices (1) to (3) were calculated.

FIG. 9 is an explanatory drawing illustrating the average values of the hysteresis of the temperature characteristics at 25° C. Note that the horizontal axis in FIG. 9 indicates the distance between bonding points P, and 1100 μm is equivalent to this quartz crystal device (1), 960 μm is equivalent to this quartz crystal device (2), and 850 μm is equivalent to this quartz crystal device (3).

As illustrated in FIG. 9, at 25° C., all of these quartz crystal devices (1) to (3) have satisfactory hysteresis, and as the distance between bonding points P (the bonding angle θ) decreases, the more satisfactory characteristics are obtained.

From the measurement results illustrated in FIG. 7 to FIG. 9, these quartz crystal devices in which the bonding angle θ where the line connecting the bonding point at which the crystal element 20 is bonded to the pedestal 11 and the midpoint of the center line meets the center line is in the range of 22° to 30° have the effects of allowing obtaining the satisfactory frequency/temperature characteristics, and especially allowing further improving the hysteresis at ordinary temperature (25° C.) with θ around 25°.

Application to Product

Note that in the embodiments, the crystal unit has been described as an example. However, this disclosure is also applicable to an oscillator that includes an IC on a lower side of a pedestal in a depressed portion of a package and an oscillator that includes the crystal element 20 in one of two depressed portions of an H type package and includes an IC in the other one.

For example, this disclosure is also applicable to a Temperature Compensated Crystal Oscillator (TCXO), a crystal controlled oscillator for clock (ICXO), a Simple Packaged Crystal Oscillator (SPXO), and a Voltage Controlled Crystal Oscillator (VCXO).

Note that, to manufacture the product, according to the side ratio of the crystal element 20 used, the optimal bonding angle θ may be obtained in advance by calculation (or experimentally), and the distance between bonding points P at which the optimal bonding angle is achieved may be set according to the actual dimensions of the crystal element 20 and the position of the pedestal 11.

Setting the optimal distance between bonding points P allows easily designing the bonding angle in the desired range by only measuring the dimensions without measuring the angle.

Effects of the Embodiments

This quartz crystal device includes the pedestal 11 on which the crystal element 20 is mounted inside the package 10. The crystal element 20 is bonded to the pedestal 11 at the four points. The center line m connecting the midpoints on both short sides of the crystal element 20 meets the straight line connecting the center Q of the crystal element 20 and each of the bonding points at the angle of 22° or more and 30° or less. This brings effects of ensuring achieving the quartz crystal device having the satisfactory acceleration sensitivity characteristics small in variation.

Additionally, according to this crystal unit, the center line m connecting the midpoints on both short sides of the crystal element 20 meets the straight line connecting the center Q of the crystal element 20 and each of the bonding points at the angle of 22° or more and 25° or less. Accordingly, in addition to the acceleration sensitivity characteristics, this allows bringing effects of satisfactory frequency/temperature characteristics and hysteresis.

This disclosure is suitable for the quartz crystal device having the satisfactory acceleration sensitivity characteristics small in variation.

In this disclosure, in the quartz crystal device described above, the angle formed by the center line and the straight line connecting the center point of the center line and each of the bonding points is 25° or more and 28° or less.

Additionally, in this disclosure, a crystal unit includes the quartz crystal device described above.

Additionally, in this disclosure, a crystal controlled oscillator includes an oscillator circuit and the quartz crystal device described above. The oscillator circuit amplifies an oscillation frequency.

With this disclosure, in the quartz crystal device, the crystal element is bonded to the pedestal disposed in the package at the four points. The angle formed by the center line connecting the midpoints of both short sides of the crystal element and the straight line connecting the center point of the center line and each of the bonding points is 22° or more and 30° or less. Therefore, this brings an effect of ensuring achieving the quartz crystal device having satisfactory acceleration sensitivity characteristics small in variation.

The principles, exemplary embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:
1. A quartz crystal device comprising:
a package;
a pedestal disposed in the package; and
a crystal element bonded to the pedestal at four points, wherein
an angle formed by a center line connecting midpoints of both short sides of the crystal element and a straight line connecting a center point of the center line and each of bonding points is 22° or more and 30° or less.
2. The quartz crystal device according to claim 1, wherein the angle formed by the center line and the straight line connecting the center point of the center line and each of the bonding points is 25° or more and 28° or less.
3. A crystal unit comprising:
the quartz crystal device according to claim 1.
4. A crystal controlled oscillator comprising:
an oscillator circuit that amplifies an oscillation frequency; and
the quartz crystal device according to claim 1.

* * * * *